United States Patent
El Mallawany (10) Patent No.: US 10,287,851 B2
(45) Date of Patent: May 14, 2019

(54) ELECTRICAL SYSTEM AND METHOD FOR SELECTIVE CONTROL OF DOWNHOLE DEVICES

(71) Applicant: Halliburton Energy Services, Inc., Houston, TX (US)

(72) Inventor: Ibrahim El Mallawany, Spring, TX (US)

(73) Assignee: Halliburton Energy Services, Inc., Houston, TX (US)

(*) Notice: Subject to any disclaimer, the term of this patent is extended or adjusted under 35 U.S.C. 154(b) by 226 days.

(21) Appl. No.: 15/301,288

(22) PCT Filed: Dec. 28, 2015

(86) PCT No.: PCT/US2015/067564
§ 371 (c)(1),
(2) Date: Sep. 30, 2016

(87) PCT Pub. No.: WO2017/116381
PCT Pub. Date: Jul. 6, 2017

(65) Prior Publication Data
US 2018/0016865 A1    Jan. 18, 2018

(51) Int. Cl.
  E21B 34/00    (2006.01)
  E21B 34/06    (2006.01)
  E21B 47/12    (2012.01)
  E21B 34/10    (2006.01)
  H03K 17/292   (2006.01)
  E21B 43/14    (2006.01)

(52) U.S. Cl.
  CPC .......... *E21B 34/066* (2013.01); *E21B 34/10* (2013.01); *E21B 47/121* (2013.01); *H03K 17/292* (2013.01); *E21B 43/14* (2013.01)

(58) Field of Classification Search
  CPC .................................................. E21B 34/066
  USPC ........................................................ 307/38
  See application file for complete search history.

(56) References Cited

U.S. PATENT DOCUMENTS

| 3,887,849 | A | * | 6/1975 | Nagel ................ H02H 11/002 |
| | | | | 361/100 |
| 4,178,579 | A | | 12/1979 | McGibbeny et al. |
| 5,398,713 | A | | 3/1995 | Whitman |
| 5,515,038 | A | | 5/1996 | Smith |

(Continued)

OTHER PUBLICATIONS

International Search Report and Written Opinion issued in corresponding PCT application No. PCT/2015/067564 dated Sep. 21, 2016, 10 pgs.

*Primary Examiner* — Adi Amrany
(74) *Attorney, Agent, or Firm* — Chamberlain Hrdlicka (57) ABSTRACT

A method of actuating a selected electrically powered device such as a solenoid operated valve (SOV) among a plurality of electrically powered devices coupled between a first conductor and second conductor includes applying a high voltage differential between the first conductor and the second conductor, the high voltage being at least as high as the breakover voltage of a switching thyristor coupled to the selected electrically powered devices. The method also includes applying a low voltage differential between the first conductor and the second conductor after applying the high voltage, the low voltage being lower than the breakover voltage of any switching thyristor coupled to the plurality of electrically powered devices.

18 Claims, 7 Drawing Sheets

(56) References Cited

U.S. PATENT DOCUMENTS

| | | | |
|---|---|---|---|
| 6,138,754 A | 10/2000 | Veneruso et al. | |
| 6,693,410 B1 * | 2/2004 | Terrien | G05F 1/575 |
| | | | 323/273 |
| 7,520,321 B2 * | 4/2009 | Hiron | E21B 47/12 |
| | | | 166/65.1 |
| 7,546,479 B2 * | 6/2009 | Saputro | G06F 1/3203 |
| | | | 713/330 |
| 8,476,786 B2 * | 7/2013 | Shaw | E21B 17/003 |
| | | | 307/31 |
| 8,590,609 B2 * | 11/2013 | Smithson | E21B 23/00 |
| | | | 166/316 |
| 8,757,278 B2 | 6/2014 | Smithson | |
| 2009/0295597 A1 | 12/2009 | Grimseth | |
| 2010/0236790 A1 * | 9/2010 | Smithson | E21B 23/00 |
| | | | 166/373 |

\* cited by examiner

ELECTRICAL SYSTEM AND METHOD FOR SELECTIVE CONTROL OF DOWNHOLE DEVICES

BACKGROUND

This section is intended to introduce the reader to various aspects of art that may be related to various aspects of the presently described embodiments. This discussion is believed to be helpful in providing the reader with background information to facilitate a better understanding of the various aspects of the described embodiments. Accordingly, it should be understood that these statements are to be read in this light and not as admissions of prior art.

Oil and gas wells formed in the earth and often traverse several formation layers or regions of the earth, which may include one or more hydrocarbon reservoirs. Production tubing is disposed in the well and production fluid from the hydrocarbon reservoirs flows to the surface through the production tubing. During some production operations, it may be beneficial to independently control the flow of fluid from different regions of the reservoirs into the production tubing. Packers are disposed in an annulus between the wellbore and the production tubing to isolate the reservoir into different zones.

Each corresponding portion of the production tubing includes a valve. When the valve is open, fluid can flow from the respective reservoir zone into the production tubing. When the valve is closed, fluid from the respective reservoir zone is prevented from flowing into the production tubing. Thus, the flow of fluid from each zone into the production tubing can be controlled by controlling the opening and closing of the corresponding valve.

In many systems, opening and closing of each valve requires electrical operation of an actuator such as a solenoid operated valve (SOV), a motor a heating coil, among others. A single system may have many actuators (e.g., SOVs), each of which needs to be controllable independently of the others. Currently, enabling such a control scheme requires increasing the number of conductor lines or the number of electronic components as the number of SOVs increases.

BRIEF DESCRIPTION OF THE DRAWINGS

For a detailed description of the embodiments of the invention, reference will now be made to the accompanying drawings in which.

DETAILED DESCRIPTION

The present disclosure provides methods and systems for selectively controlling any number of solenoid operated valves (SOVs), or elements of similar function, with two conductor lines.

Figure 1:
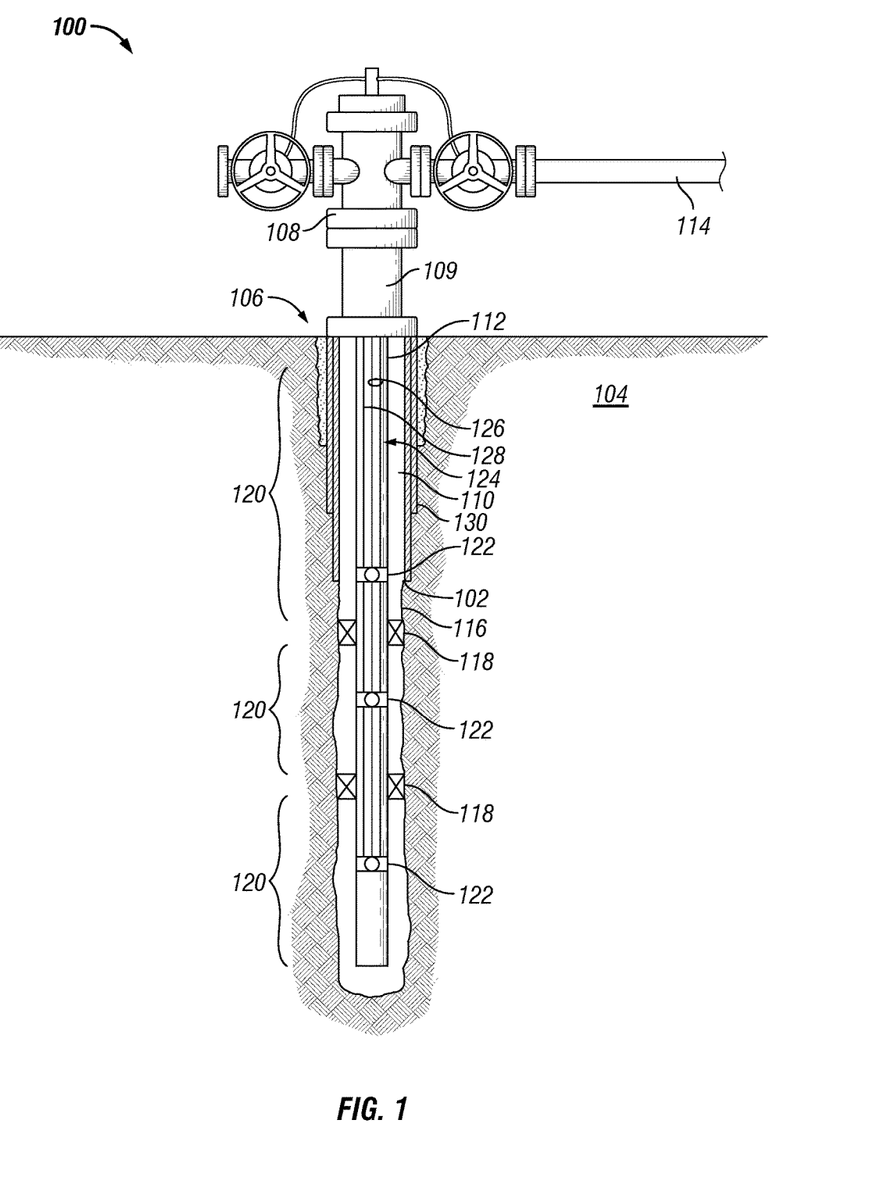
FIG. 1 illustrates a well system with a multi-zone control system.

FIG. 1 illustrates a production well system 100 with isolated production zones. The well system 100 includes a well 102 formed within a formation 104. The well 102 may be a vertical wellbore as illustrated or it may be a horizontal or directional well. The formation 104 may be made up of several geological layers and include one or more hydrocarbon reservoirs. In certain example embodiments, the well system 100 may include a production tree 108 and a wellhead 109 located at a well site 106. A production tubing 112 extends from the wellhead 109 into the well 102, traversing the formation 104.

In some embodiments, the wellbore 102 is cased with one or more casing segments 130. The casing segments 130 help maintain the structure of the well 102 and prevent the well 102 from collapsing in on itself. In some embodiments, a portion of the well is not cased and may be referred to as "open hole." The space between the production tubing 112 and the casing 130 or wellbore wall 116 is an annulus 110. Production fluid enters the annulus 110 from the formation 104 and then enters the production tubing 112 from the annulus 110. The production tubing 112 carries the production fluid uphole to the production tree 108. The production fluid may then be delivered to various surface facilities for processing via a surface pipeline 114.

The well 102 is separated into a plurality of zones with packers 118 disposed in the annulus space 110. The packers 118 separate the well 102 into isolated zones 120. Each portion of the production tubing disposed within one of the zones 120 includes a production tubing valve 122. When the production tubing valve 122 is open, fluid can flow from the respective zone 120 into the production tubing 112. When the production tubing valve 122 is closed, fluid from the respective zone 120 is prevented from flowing into the production tubing 112. Thus, the flow of fluid from each zone 120 into the production tubing 112 can be controlled by controlling the opening and closing of the corresponding production tubing valve 122.

Figure 2:
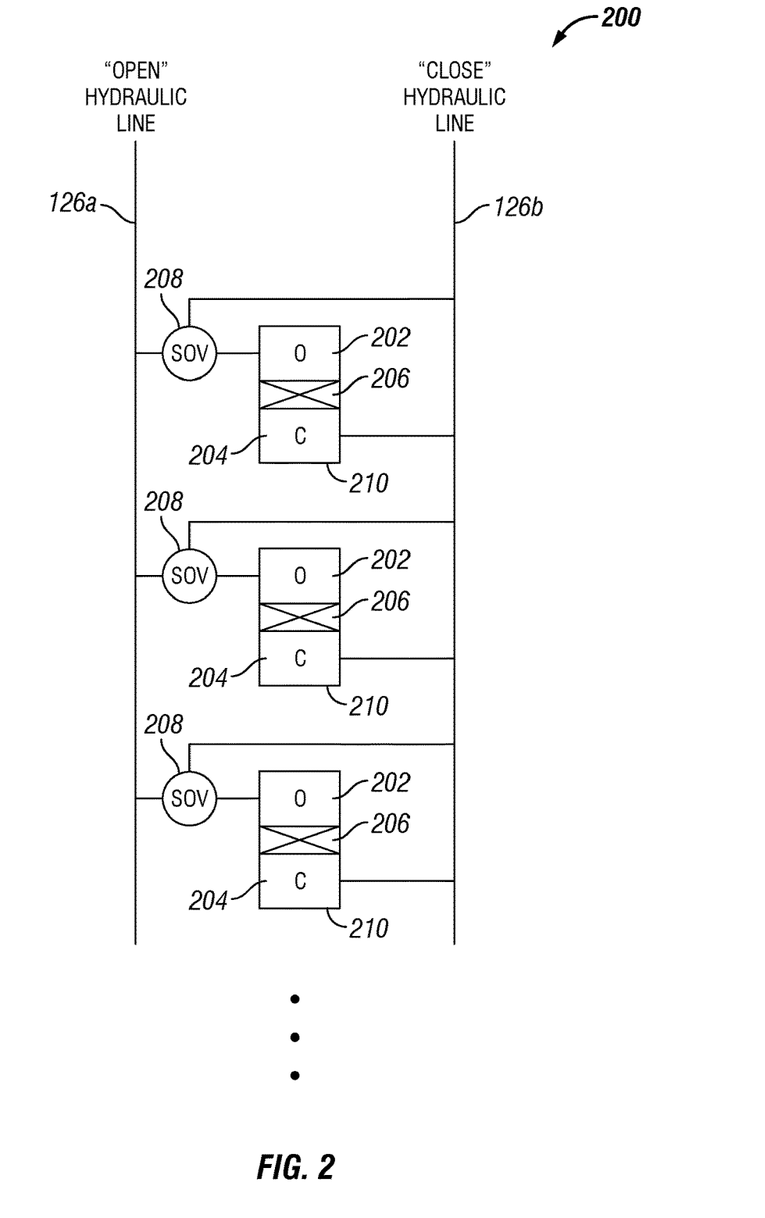
FIG. 2 is a schematic of a hydraulic portion of the multi-zone control system.

In some embodiments, the production tubing valves 122 are operated hydraulically and controlled by a valve control system 124. The valve control system 124 includes a hydraulic system with two hydraulic lines 126 and an electrical system with an electrical line 128. FIG. 2 is a schematic illustrating a hydraulic system 200 of the valve control system 124. The hydraulic system 200 includes an open hydraulic line 126a, a close hydraulic line 126b, and a piston device 210 coupled to each production tubing valve 122. Each piston device 210 includes a close chamber 210 and an open chamber 202, separated by a piston 206. The close chamber 210 is hydraulically coupled to the close hydraulic line 126b. The open chamber 202 is hydraulically coupled to an electrically powered device such as an SOV 208 that is coupled to both the open hydraulic line 126a and the close hydraulic line 126b. In some embodiments, the SOVs 208 can be replaced by motors or other devices configured to couple and decouple hydraulic lines similarly to the SOVs upon receiving an electric current.

The piston 206 is configured to move when there is a pressure differential between the close chamber 210 and the open chamber 202, thereby opening or closing the respective production tubing valve 122. Thus, in order to close the valve, the close chamber 204 is pressurized via the close hydraulic line 126b, bleeding the open chamber 202 through the open hydraulic line 126a. The piston 206 and the corresponding production tubing valve 122 are thereby moved into the close position. Inversely, in order to open a production tubing valve 122, the open chamber 202 is pressurized via the open hydraulic line 126a and the close chamber 210 is bled through the close hydraulic line 126b. In both cases, a pressure differential between the open hydraulic line 126a and the close hydraulic line 126b must be applied.

However, multiple piston devices 210 are controlled on the same open hydraulic line 126a and close hydraulic line 126b. Thus, in order to operate each the production tubing valves 122 independently and one at a time, one of chambers 202 and 204 (e.g., open chamber 202) of each piston device 210 is coupled to an SOV 208.

When there is no current flowing through an SOV 208 (i.e., the SOV 208 is not actuated), chamber 202 is hydraulically coupled to the close hydraulic line 126b and separated from the open hydraulic line 126a, and thus not affected by hydraulic pressure in the open hydraulic line 126a. When a current is flowing through the SOV 208 (i.e., the SOV 208 is actuated), chamber 202 is connected to the open hydraulic line 126a and separated from the close hydraulic line 126b.

Figure 3:
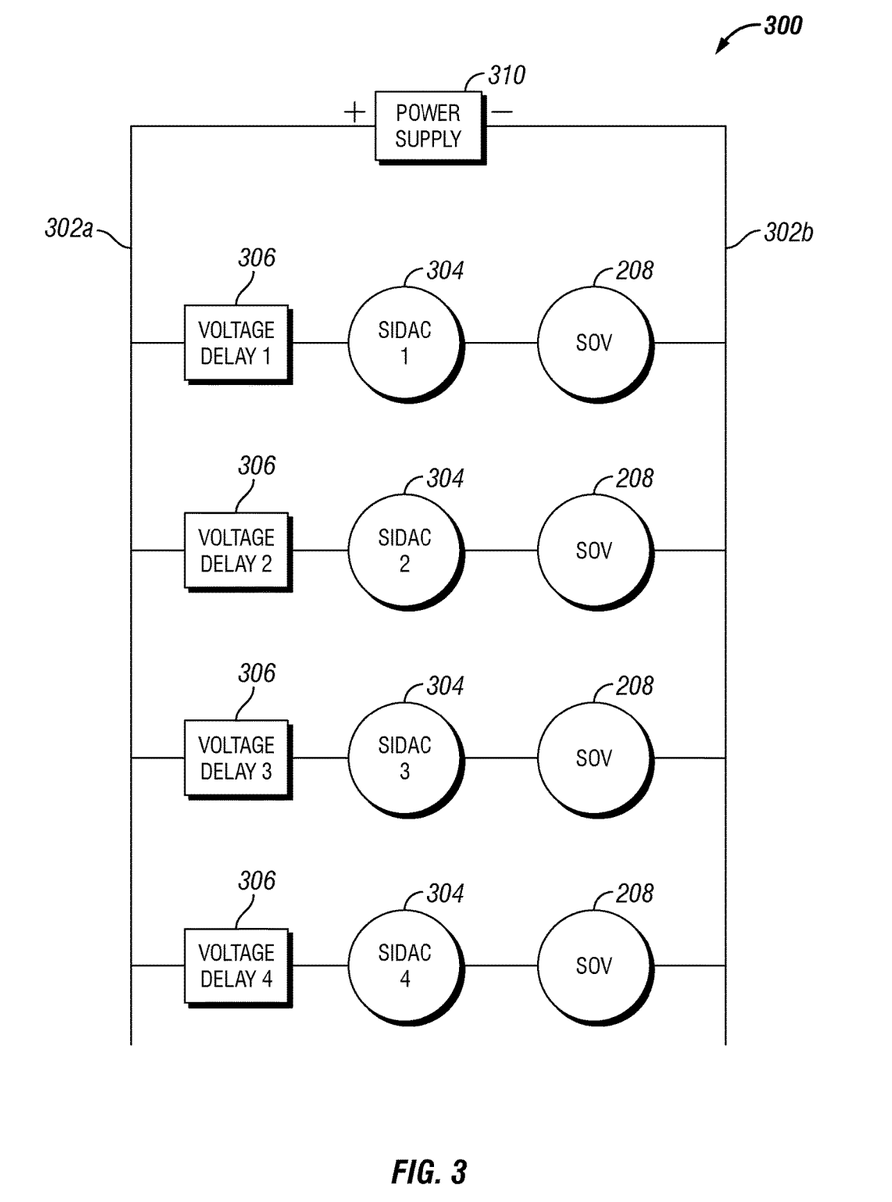
FIG. 3 is a schematic of an electric system which enables selective control of a plurality of valves in the hydraulic portion of the multi-zone control system.

Thus, a production tubing valve 122 can be controlled independently by actuating the corresponding SOV 208 and keeping the other SOVs 208 unactuated. The SOVs 208 are controlled via the electrical system of the valve control system 126. FIGS. 3-7 illustrate example embodiments of the electrical system 300 which is the focus of the present disclosure. FIG. 3 illustrates a schematic of an example electrical system 300 for independently controlling the SOVs 208. The electrical system 300 includes a first conductor 302a and a second conductor 302b. In some embodiments, the first conductor 302a may be an electrical line and the second conductor 302b may be the production tubing 112. The conductors 302 are coupled to a power supply 310 or control center above ground.

The system 300 includes a plurality of SOVs 208. In some embodiments, the SOVs are coupled in parallel between the first conductor 302a and the second conductor 302b such that each of the SOVs 208 can be powered by a voltage differential between the first conductor 302a and the second conductor 302b. In some embodiments, each SOV 208 is coupled to a SIDAC 304 (silicon diode for alternating current). Each SIDAC 304 is configured to conduct electrical current only after it receives a voltage greater than its breakover voltage. After the breakover voltage is reached, the SIDAC 304 continues to conductor electrical current as long as it continues to receive any voltage, regardless of whether the voltage is above the breakover voltage. The SIDAC 304 resets when the voltage drops close to zero and ceases to conduct current. Thus, the SIDACs 304 are coupled to the respective SOV 208 in a way such that the SOV only sees a current when the respective SIDAC conducts current. In the illustrated example, the SOVs are coupled in series with the respective SIDACs 304 between the conductors 302. In certain embodiments, each SIDAC 304 in the system 300 has a different breakover voltage. In some embodiments, the SIDACs 304 may be replaced by a DIAC (diode for alternating current) or other thyristor device.

One or more of the SIDACs 304 may be coupled to a voltage delay device 306. Each voltage delay device 306 is configured to receive a voltage and apply a voltage to the respective SIDAC 304 after a time delay. In some embodiments, the voltage delay device 306 is coupled between the respective SIDAC 304 and one of the conductors 302. In some embodiments, the voltage delay device 306 is coupled in parallel with the respective SIDAC 304. The voltage delay device 306 may include from a variety of electronic components, such as capacitors, resistors, inductors, transistors, thyristors or any combination thereof. In some embodiments, the voltage delay device 306 may include a circuit or integrated circuit (IC) especially designed for the purpose of delaying voltage to the respective SIDAC 304. The voltage delay device 306 may be designed to provide a specific amount of time delay. In some embodiments, each voltage delay device 306 is electrically coupled to the first conductor 302a. In certain such embodiments, each of the voltage delay devices 306 is designed to provide a different time delay such that when a voltage differential is applied between the first conductor and the second detector. Thus, the SIDACs 304 see the voltage at different times. In some embodiments, the time delays provided by the voltage delay devices 306 may be on the order of milliseconds.

Figure 4:
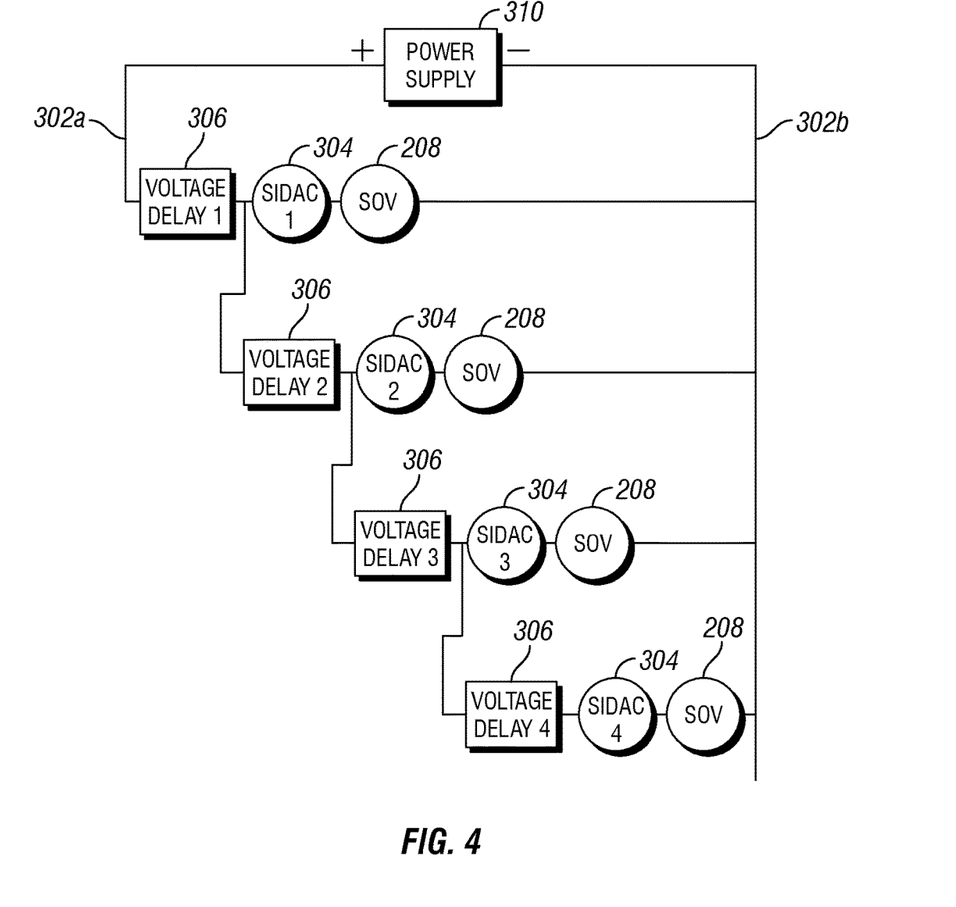
FIG. 4 is a schematic of an electric system with cascading voltage delay devices.

FIG. 4 illustrates an embodiment of the electrical system 400 with cascading voltage delay devices 306. In certain embodiment, rather than each voltage delay device 306 being coupled to the first conductor 302, each voltage delay device 306, with the exception of one, is coupled to the output a previous voltage delay device 306. As such, a SIDAC 304 experiences the combined time delay provided by all previous voltage delay devices 306, as voltage is not applied to a subsequent voltage delay device 306 until after the time delay provided by the previous voltage delay devices 306. In such embodiments, each of the voltage delay devices 306 may be the same and provide the same time delay, as the effective delay provided to each SIDAC will be different. For example, the time delay applied to SIDAC 2 is the combination of the time delays of voltage delay device 1 and voltage delay device 2. Thus in order for an SOV 208 to see a current, and thereby be actuated, the combined time delay period must pass between initial voltage being applied to the first conductor and the respective SIDAC 304 receiving the voltage, and the voltage must be at least as great as the breakover voltage of the SIDAC 304. Otherwise, the SOV 208 is not actuated.

The SIDACs 304 are chosen or configured such that their breakover voltage is inversely related to the effective time delay provided by the respective time delay devices 306. For example, the SIDAC 304 with the highest relative breakover voltage experiences the smallest time delay before it sees the voltage differential applied between the first and second conductors 302. Accordingly, the SIDAC 304 with the lowest breakover voltage experiences the largest amount of relative time delay. This is enabled by designing or selecting the voltage delay devices 306 to provide the appropriate time delay for the respective SIDACs 304.

The electrical systems 300, 400 make it possible to selectively actuate any one of the SOVs 208 independently through only two control conductors. Referring to FIG. 3, a method of actuating a selected SOV 208 among a plurality of SOVs 208 includes first applying a high voltage differential between the first conductor 302a and the second conductor 302b. The high voltage should be at least as high as the breakover voltage of the SIDAC 304 coupled to the selected SOV 208. However, the voltage delay device 306 coupled to the SIDAC 304 prevents the SIDAC 304 from seeing the voltage until after a time delay. After the time delay, the SIDAC 304 sees the voltage and conducts a current to the SOV 208, actuating the SOV 208. However, the applied high voltage should be less than the breakover voltage of any SIDAC 304 having a higher breakover voltage. This prevents the SOVs 208 coupled to those SIDACs 304 from being actuated. In order to prevent the SOVs 208 coupled to SIDACs having lower breakover voltages from being actuated, those SIDACs are coupled to voltage delay devices 306 which provide a longer delay period.

After the selected SOV 208 is actuated, the high voltage is reduced to a low voltage before the SIDACs 304 with lower breakover voltage sees the voltage. The low voltage should be lower than the breakover voltage of any SIDAC 304 in the system. Thus, in some embodiments, any SIDAC 304 with a lower breakover voltage is coupled to a voltage delay device having a higher time delay, relative to the selected SOV 208. This way, the selected SOV 208 can be actuated without actuating any other SOV 208 being powered through the same two conductors by following the control scheme discussed above. Table 1 illustrates operational parameters of an example system 300 following the control scheme. The specific values are for illustrative purposes and may be vary in actual implementations.

TABLE 1

|  | Time Delay provided by Voltage delay device | SIDAC breakover voltage | High voltage Applied | Low Voltage Applied | Duration of High Voltage |
|---|---|---|---|---|---|
| SOV 1 | 1 ms | 180 V | $V_h \geq 180$ | $120 > V_l$ | 2 ms > $t \geq 1$ ms |
| SOV 2 | 2 ms | 160 V | $180 > V_h \geq 160$ | $120 > V_l$ | 3 ms > $t \geq 2$ ms |
| SOV 3 | 3 ms | 140 V | $160 > V_h \geq 140$ | $120 > V_l$ | 4 ms > $t \geq 3$ ms |
| SOV 4 | 4 ms | 120 V | $140 > V_h \geq 120$ | $120 > V_l$ | $t \geq 4$ ms |

The control steps for actuating each SOV can be preprogrammed such that the power supply is automatically controlled to apply the appropriate voltage levels for the right amount of time.

Figure 5:
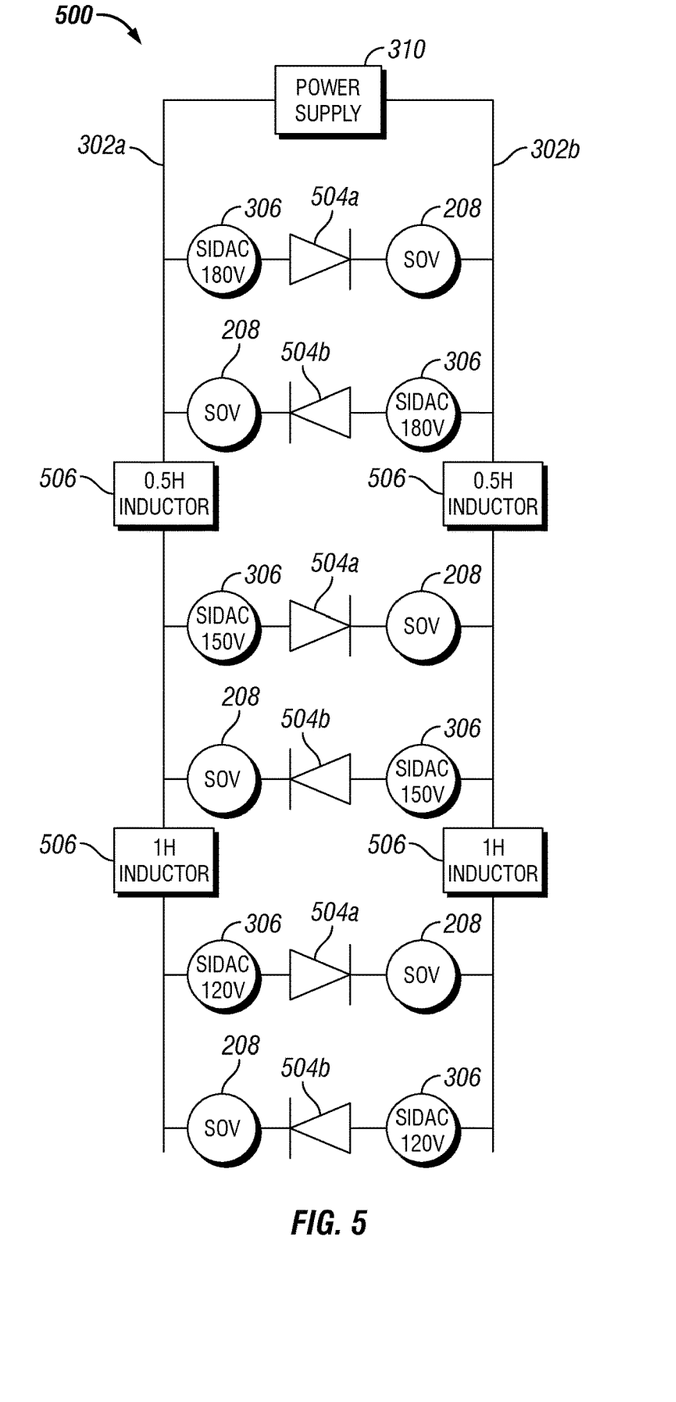
FIG. 5 is a schematic of an embodiment of an electric system utilizing inductors as voltage delay devices.

FIG. 5 illustrates a schematic of another embodiment of an electric system 500. The system 500 also utilizes a first conductor 302a and a second conductor 302b. The system 500 also includes a plurality of SOVs 208, all or a subset of which are each coupled to a SIDAC 306 and a diode 504. In some embodiments, a first group of the diodes 504 are coupled such that the anode is directed towards the first conductor 302a and the cathode is directed towards the second conductor 302b. A second group of the diodes 504 are coupled with the anode directed towards a second conductor 302b and the cathode directed towards the first conductor 302a.

With reference to FIG. 5, the first group of diodes 504 is referred to as right-flowing diodes 504a and the second group of diodes 504 is referred to as left-flowing diodes 504b. Thus, any SIDAC 306 or SOV 208 serially coupled to a right-flowing diode 504a is only capable of being powered when the polarity of the power supply 310 is such that the current flows from the first conductor 302a to the second conductor 302b. Similarly, any SIDAC 306 or SOV 208 serially coupled to a left-flowing diode 504b is only capable of being powered when the polarity of the power supply 310 is such that the current flows from the second conductor 302b to the first conductor 302a. Thus, by selecting the polarity of the power supply 310 corresponding to the diode 504 of the selected SOV 208, the portion of SOVs 208 with oppositely coupled diodes 504 is prevented from being actuated. For example, when the selected SOV 208 is serially coupled to a right-flowing diode 504a, the polarity of the power supply 310 is configured such that current flows from the first conductor 302a to the second conductor 302b.

Thus, all SOVs serially coupled to left-flowing 504b diodes cannot be actuated. However, the remaining SOVs 208 coupled to right-flowing 504a diodes must also be prevented from being actuated when actuating the selected SOV 208. This can be done by designing the associated SIDACs 306 to have different breakover voltages, separating then with voltage delay devices 506 providing different time delays, and applying a high/low voltage timing scheme similar to that discussed above with reference to FIGS. 3 and 4. In the embodiment of FIG. 5, the voltage delay devices 506 are inductors.

Figure 6:
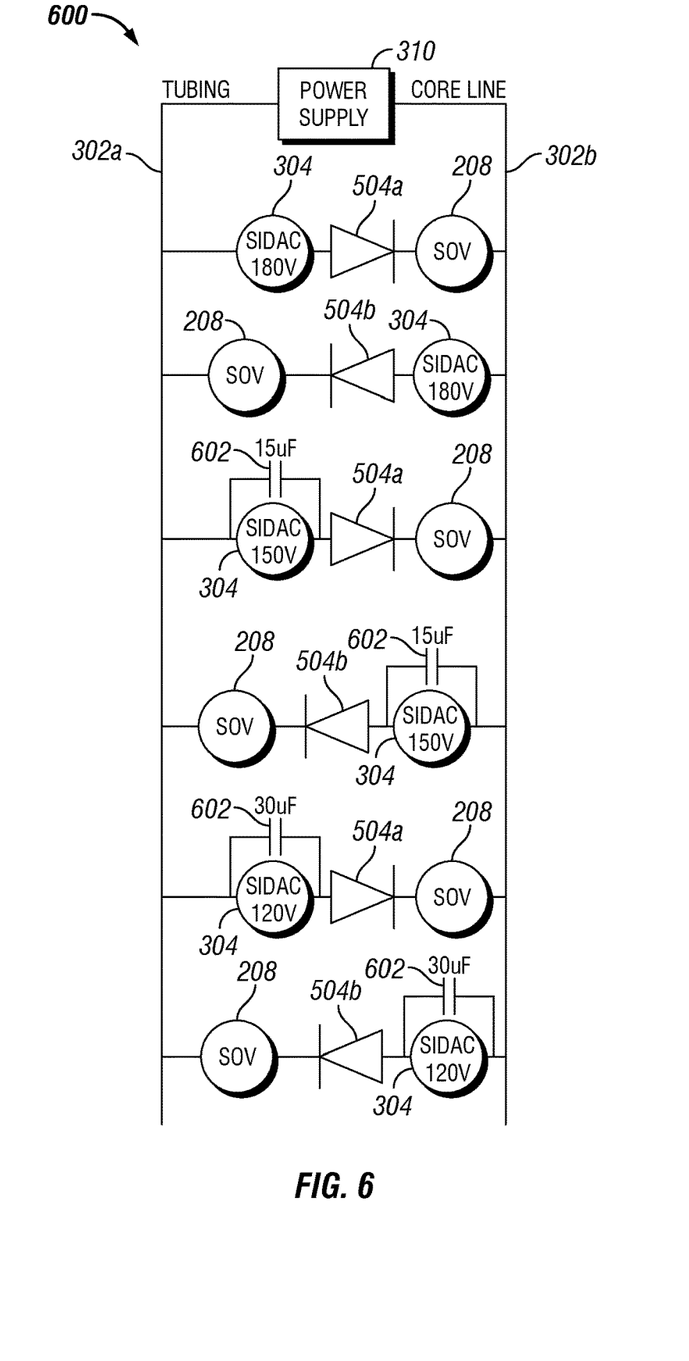
FIG. 6 is a schematic of an embodiment of the electric system utilizing capacitors as voltage delay devices.

FIG. 6 illustrates an example electrical system 600 similar to the electrical system 500 of FIG. 5 with the exception that electrical system 600 utilizes capacitors 602 as voltage delay devices. In some embodiments, the capacitors 602 are coupled in parallel with the respective SIDACs 304 such that voltage is supplied to the capacitors 602 instead of the SIDACs 304 until the capacitors 602 are charged, creating the time delay.

Figure 7:
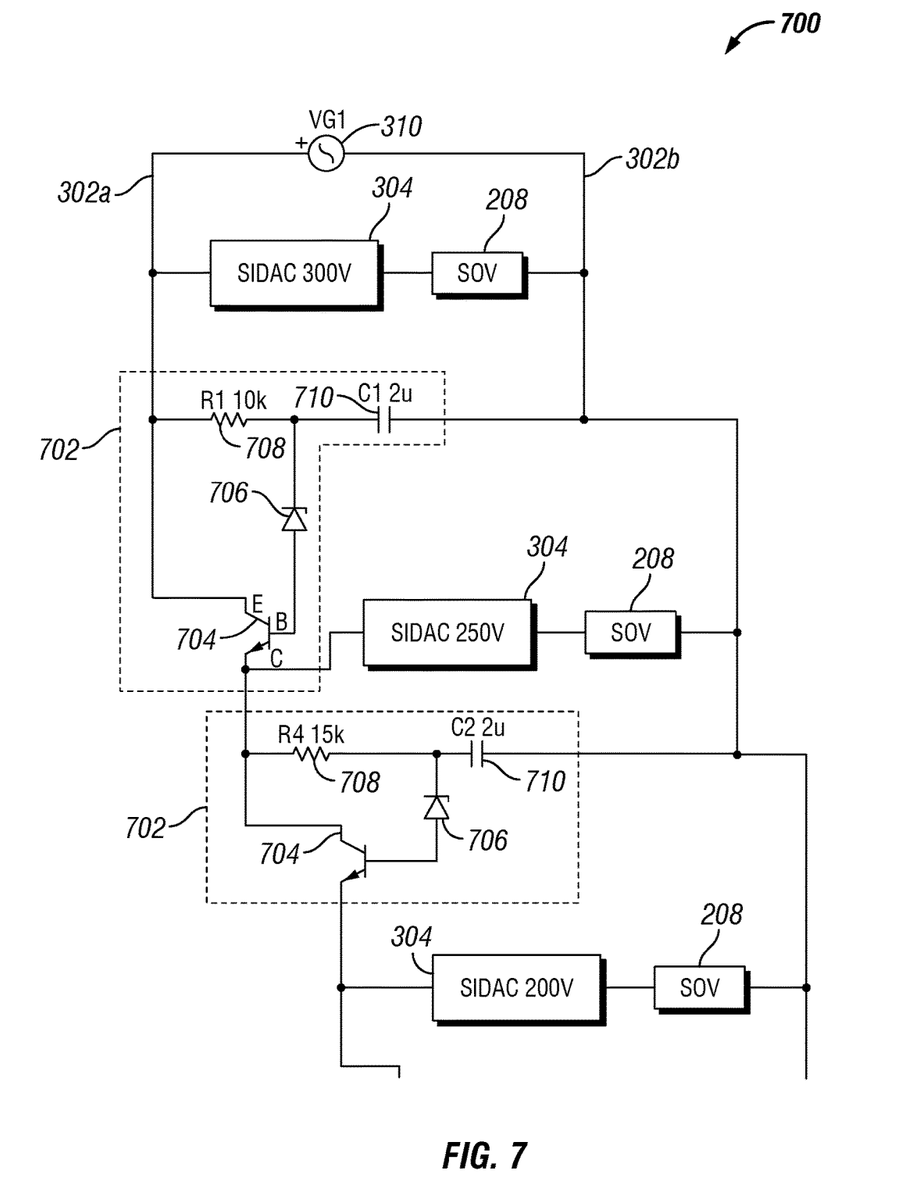
FIG. 7 is a schematic of another embodiment of the electric system utilizing voltage delay circuits as voltage delay devices.

FIG. 7 illustrates a schematic of another example of an electrical system 700. The electrical system 700 utilizes voltage delay circuits 702 to provide time delays. In some embodiments, each voltage delay circuit 702 includes a thyristor or transistor 704, a zener diode 706, a resistor 708, and a capacitor 710. The structural and operating principles are similar to that of electrical system 400 of FIG. 4 in which the time delay experienced by a SIDAC 304 is the combined time delay of the voltage delay circuits 702 between the SIDAC and the first conductor 302a or power supply 310. Electrical system 700 is similar to electrical system 400 in which the voltage delay circuit 702 performs the functions of the voltage delay device 306 and can be operated using the same control scheme principles.

In addition to the embodiments described above, many examples of specific combinations are within the scope of the disclosure, some of which are detailed below:

Example 1

An electrical system for selective control of a downhole system, comprising:
 a first conductor;
 a second conductor;
 a first electrically powered device coupled between the first conductor and the second conductor
 a first switching thyristor coupled between the first conductor and the second conductor in series with the first electrically powered device; and
 a first voltage delay device coupled to the first switching thyristor and configured to prevent a voltage from being applied to the first switching thyristor for a first amount of time.

Example 2

The electrical system of claim 1, further comprising:
 a second electrically powered device coupled between the first conductor and the second conductor parallel to the first electrically powered device; and
 a second switching thyristor coupled to the second electrically powered device and comprising a lower breakover voltage than the first switching thyristor.

Example 3

The electrical system of claim 2, further comprising a second voltage delay device coupled to the second switching thyristor and configured to prevent a voltage from being applied to the second switching thyristor for a second amount of time that is longer than the first amount of time.

Example 4

The electrical system of claim 1, wherein the first electrically powered device comprises a solenoid operate valve (SOV), a motor, a heat coil, an actuator, a hydraulic switching device, or any combination thereof.

Example 5

The electrical system of claim 1, wherein the first voltage delay device is one of an inductor, a capacitor, a voltage delay circuit, an integrated circuit, or any combination thereof.

Example 6

The electrical system of claim 1, wherein the switching thyristor comprises a comprises a silicon diode for alternating current (SIDAC).

Example 7

The electrical system of claim 1, wherein the electrically powered device is configured to couple hydraulic lines when actuated.

Example 8

The electrical system of claim 1, wherein the first conductor comprises a first wire and the second conductor comprises a second wire or a production pipe.

Example 9

The electrical system of claim 1, further comprising a diode coupled to the first switching thyristor.

Example 10

A method of selectively controlling a plurality of valves, comprising:
　applying a voltage to an electrical valve control system, the electrical valve control system comprising a plurality of electrically powered devices, each electrically powered device coupled to a switching thyristor, and each switching thyristor coupled to a voltage delay device;
　delaying transmission of the voltage to a selected electrically powered device from the plurality of electrically powered devices for a set voltage delay duration, the set voltage delay duration provided by the voltage delay device coupled to the switching thyristor that is coupled to the selected electrically powered device;
　actuating the selected electrically powered device after the set voltage delay duration; and
　reducing the voltage after actuation of the selected electrically powered device.

Example 11

The method of claim 10, wherein actuating the selected electrically powered device comprises applying the voltage at a first level for the set duration, the first level being at least as high as a breakover voltage of the switching thyristor coupled to the selected electrically powered device and lower than a breakover voltage of any switching thyristor coupled to any voltage delay device providing a voltage delay duration less than the set duration.

Example 12

The method of claim 10, wherein the set duration is less than the set voltage delay duration of any voltage delay device coupled to any switching thyristor having a breakover voltage equal to or lower than the breakover voltage of the switching thyristor coupled to the selected electrically powered device.

Example 13

The method of claim 10, further comprising reducing the voltage to a low level after the set voltage delay duration, wherein the low level is lower than the breakover voltage of any of the switching thyristors.

Example 14

The method of claim 10, wherein the voltage delay device comprises an inductor, a capacitor, a voltage delay circuit, an integrated circuit, or any combination thereof.

Example 15

The method of claim 10, wherein the switching thyristor comprises a SIDAC.

Example 16

The method of claim 10, comprising dropping the voltage to zero before actuating a different electrically powered device.

Example 17

A method of actuating a selected electrically powered device among a plurality of electrically powered devices coupled between a first conductor and second conductor, comprising:
　applying a high voltage differential between the first conductor and the second conductor, the high voltage being at least as high as the breakover voltage of a switching thyristor coupled to the selected electrically powered device; and
　applying a low voltage differential between the first conductor and the second conductor after applying the high voltage, the low voltage being lower than the breakover voltage of any switching thyristor coupled to the plurality of electrically powered devices.

Example 18

The method of claim 17, further comprising reducing the high voltage to the low voltage after a time delay, the time delay being at least as long as the amount of time it takes for a voltage delay device coupled to the switching thyristor coupled to the selected electrically powered device to transmit the high voltage.

Example 19

The method of claim 18, wherein the time delay is less than the amount of time it takes for a time delay element coupled to a switching thyristor whose breakover voltage is less than the high voltage to pass the high voltage.

Example 20

The method of claim 17, comprising:
applying the high voltage differential in a first direction when the selected electrically powered device is coupled to a diode with a cathode directed towards the first conductor; and
applying the high voltage differential in second direction when the selected electrically powered device is coupled to a diode with a cathode directed towards the second conductor.

This discussion is directed to various embodiments of the invention. The drawing figures are not necessarily to scale. Certain features of the embodiments may be shown exaggerated in scale or in somewhat schematic form and some details of conventional elements may not be shown in the interest of clarity and conciseness. Although one or more of these embodiments may be preferred, the embodiments disclosed should not be interpreted, or otherwise used, as limiting the scope of the disclosure, including the claims. It is to be fully recognized that the different teachings of the embodiments discussed may be employed separately or in any suitable combination to produce desired results. In addition, one skilled in the art will understand that the description has broad application, and the discussion of any embodiment is meant only to be exemplary of that embodiment, and not intended to intimate that the scope of the disclosure, including the claims, is limited to that embodiment.

Certain terms are used throughout the description and claims to refer to particular features or components. As one skilled in the art will appreciate, different persons may refer to the same feature or component by different names. This document does not intend to distinguish between components or features that differ in name but not function, unless specifically stated. In the discussion and in the claims, the terms "including" and "comprising" are used in an open-ended fashion, and thus should be interpreted to mean "including, but not limited to . . . ." Also, the term "couple" or "couples" is intended to mean either an indirect or direct connection. In addition, the terms "axial" and "axially" generally mean along or parallel to a central axis (e.g., central axis of a body or a port), while the terms "radial" and "radially" generally mean perpendicular to the central axis. The use of "top," "bottom," "above," "below," and variations of these terms is made for convenience, but does not require any particular orientation of the components.

Reference throughout this specification to "one embodiment," "an embodiment," or similar language means that a particular feature, structure, or characteristic described in connection with the embodiment may be included in at least one embodiment of the present disclosure. Thus, appearances of the phrases "in one embodiment," "in an embodiment," and similar language throughout this specification may, but do not necessarily, all refer to the same embodiment.

Although the present invention has been described with respect to specific details, it is not intended that such details should be regarded as limitations on the scope of the invention, except to the extent that they are included in the accompanying claims.

What is claimed is:

1. An electrical system for selective control of downhole devices, comprising:
   a first conductor;
   a second conductor;
   a first electrically powered downhole device coupled between the first conductor and the second conductor
   a first switching thyristor coupled between the first conductor and the second conductor in series with the first electrically powered downhole device;
   a second electrically powered device coupled between the first conductor and the second conductor parallel to the first electrically powered device;
   a second switching thyristor coupled to the second electrically powered device and comprising a lower breakover voltage than the first switching thyristor; and
   a voltage delay device coupled to the second switching thyristor and configured to prevent a voltage from being applied to the second switching thyristor for a first amount of time.

2. The electrical system of claim 1, further comprising a third voltage delay device coupled in series between the first conductor and the second conductor with a third electrically powered device, and configured to prevent a voltage from being applied to the third electrically powered device for a second amount of time that is longer than the first amount of time.

3. The electrical system of claim 1, wherein the first electrically powered device comprises a solenoid operate valve (SOV), a motor, a heat coil, an actuator, a hydraulic switching device, or any combination thereof.

4. The electrical system of claim 1, wherein the first voltage delay device is one of an inductor, a capacitor, a voltage delay circuit, an integrated circuit, or any combination thereof.

5. The electrical system of claim 1, wherein the first switching thyristor comprises a silicon diode for alternating current (SIDAC).

6. The electrical system of claim 1, wherein the first electrically powered device is configured to couple hydraulic lines when actuated.

7. The electrical system of claim 1, wherein the first conductor comprises a first wire and the second conductor comprises a second wire or a production pipe.

8. The electrical system of claim 1, further comprising a first diode directed in a first direction and coupled to the first switching thyristor or the second switching thyristor.

9. The electrical system of claim 8, comprising a second diode coupled to the first switching thyristor or the second switching thyristor that is not coupled to the first diode, wherein the second diode is directed in a second direction that is not the first direction.

10. A method of selectively controlling a plurality of valves, comprising:
    applying a first voltage in a first direction at a start time to an electrical valve control system, the electrical valve control system comprising a plurality of electrically powered devices coupled between a first conductor and a second conductor;
    actuating a first electrically powered device of the plurality of electrically powered devices with the first voltage after a first voltage delay duration since the start time, wherein the first electrically powered device is coupled to a switching thyristor having a breakover voltage less than the first voltage;
    reducing the first voltage to a low voltage after actuation of the first electrically powered device and before a second voltage delay duration has elapsed since the start time; and wherein a second electrically powered device of the plurality of electrically powered devices will not actuate before the second voltage delay duration has elapsed, and the low voltage is lower than a breakover voltage of the second electrically powered device.

11. The method of claim 10, wherein the first voltage delay duration or the second voltage delay duration is provided by an inductor, a capacitor, a voltage delay circuit, an integrated circuit, or any combination thereof.

12. The method of claim 10, wherein the switching thyristor comprises a SIDAC.

13. The method of claim 10, comprising dropping the voltage to zero before actuating the second electrically powered device with a second voltage after a second voltage delay duration since the start time, wherein the second voltage is less than the breakover voltage of the first switching thyristor and higher than the second switching thyristor.

14. The method of claim 10, wherein the first voltage delay duration is zero.

15. The method of claim 10, comprising applying the first voltage differential in an opposite direction from the first direction to power a third selected electrically powered device, wherein a diode prevented the third selected electrically powered device from actuating during application of the first voltage in the first direction.

16. A method of actuating a selected electrically powered device among a plurality of electrically powered devices, each of the electrically powered devices coupled in series to a unique combination of a switching thyristor and a voltage delay device between a first conductor and second conductor, comprising:

applying a high voltage differential between the first conductor and the second conductor, the high voltage being at least as high as the breakover voltage of a selected switching thyristor coupled to the selected electrically powered device; and reducing the high voltage differential to a low voltage differential between the first conductor and the second conductor when the selected electrically powered device is actuated, the low voltage being lower than the breakover voltage of the switching thyristors coupled to the plurality of electrically powered devices, wherein the selected electrically powered device is the first of the plurality of electrically powered devices to be actuated by the high voltage differential.

17. The method of claim 16, wherein the time delay is less than the amount of time it takes for a time delay element coupled to a switching thyristor whose breakover voltage is less than the high voltage to pass the high voltage.

18. The method of claim 16, comprising:

applying the high voltage differential in a first direction to power a first selected electrically powered device that is coupled to a diode with a cathode directed towards the first conductor without powering a second selected electrically powered device that is coupled to a diode with a cathode directed towards the second conductor; or applying the high voltage differential in second direction to power the second selected electrically powered device without powering the first selected electrically powered device.

* * * * *